US012756134B2

(12) United States Patent
Yang

(10) Patent No.: US 12,756,134 B2
(45) Date of Patent: Oct. 6, 2026

(54) ELECTRICAL CONNECTOR CAGE AND ELECTRICAL CONNECTOR

(71) Applicant: ALL BEST PRECISION TECHNOLOGY CO., LTD., Taoyuan City (TW)

(72) Inventor: Haven Yang, Taoyuan City (TW)

(73) Assignee: ALL BEST PRECISION TECHNOLOGY CO., LTD., Taoyuan City (TW)

( * ) Notice: Subject to any disclaimer, the term of this patent is extended or adjusted under 35 U.S.C. 154(b) by 337 days.

(21) Appl. No.: 18/743,086

(22) Filed: Jun. 13, 2024

(65) Prior Publication Data

US 2025/0357697 A1 Nov. 20, 2025

(30) Foreign Application Priority Data

May 17, 2024 (TW) ................................ 113118256

(51) Int. Cl.
*H01R 13/518* (2006.01)
*H01R 13/506* (2006.01)
*H05K 7/14* (2006.01)

(52) U.S. Cl.
CPC ......... *H01R 13/518* (2013.01); *H01R 13/506* (2013.01); *H05K 7/1424* (2013.01)

(58) Field of Classification Search
CPC ................ H01R 13/518; H01R 13/506; H01R 13/6586; H01R 13/6587; H05K 7/1424
USPC .............. 439/540.1, 607.21, 607.24, 607.25, 439/607.23, 607.26
See application file for complete search history.

(56) References Cited

U.S. PATENT DOCUMENTS

| | | | | |
|---|---|---|---|---|
| 7,704,097 B1 * | 4/2010 | Phillips | H05K 9/0058 439/607.21 |
| 7,869,224 B1 * | 1/2011 | Yang | G02B 6/4277 361/728 |
| 8,469,738 B2 * | 6/2013 | Long | H01R 13/658 439/541.5 |
| 2009/0257202 A1 * | 10/2009 | Lee | H05K 9/0058 361/729 |
| 2015/0364850 A1 * | 12/2015 | Yang | H01R 13/659 439/607.25 |
| 2024/0113473 A1 * | 4/2024 | Chen | H01R 13/659 |
| 2024/0164075 A1 * | 5/2024 | D'Incà | G02B 6/4246 |

* cited by examiner

*Primary Examiner* — Gary F Paumen
(74) *Attorney, Agent, or Firm* — Winston Hsu

(57) ABSTRACT

An electrical connector cage includes a plurality of slots stacked with each other. Each of the slots includes an upper plate, a lower plate and a partition plate. The partition plate connects the upper plate and the lower plate. The lower plate has a plurality of through holes. The partition plate has a plurality of abutting portions. The abutting portions of the partition plate of one of the slots pass through the through holes of the lower plate and abut against the upper plate of another one of the slots, so as to maintain an identical height of a gap between any two adjacent slots.

12 Claims, 6 Drawing Sheets

ELECTRICAL CONNECTOR CAGE AND ELECTRICAL CONNECTOR

BACKGROUND OF THE INVENTION

1. Field of the Invention

The invention relates to an electrical connector cage and, more particularly, to an electrical connector cage capable of maintaining an identical height of a gap between any two adjacent slots and an electrical connector equipped with the electrical connector cage.

2. Description of the Prior Art

Electrical connectors are used widely in applications for power or signal connection, for example for connecting an electronic host device with an external device. An electrical connector cage is fixed on a circuit board and has a plurality of slots. A plurality of electrical connection sockets on the circuit board are located in the slots. A user may insert an electronic module into the slot of the electrical connector cage to form an electrical connection with the electrical connection socket on the circuit board. In general, after the electrical connector cage and the circuit board are assembled, there will be assembly tolerances and manufacturing tolerances, such that the slots of the electrical connector cage cannot be accurately positioned with the electrical connection sockets of the circuit board. Thus, when electronic modules are inserted into different slots, they may not be reliably connected to the electrical connection sockets.

SUMMARY OF THE INVENTION

The invention provides an electrical connector cage capable of maintaining an identical height of a gap between any two adjacent slots and an electrical connector equipped with the electrical connector cage, so as to solve the aforesaid problems.

According to an embodiment of the invention, an electrical connector cage comprises a plurality of slots stacked with each other. Each of the slots comprises an upper plate, a lower plate and a partition plate. The partition plate connects the upper plate and the lower plate. The lower plate has a plurality of through holes. The partition plate has a plurality of abutting portions. The abutting portions of the partition plate of one of the slots pass through the through holes of the lower plate and abut against the upper plate of another one of the slots, so as to maintain an identical height of a gap between any two adjacent slots.

In an embodiment, each of the abutting portions is formed with a chamfer.

In an embodiment, each of the abutting portions is formed with a rounded corner.

In an embodiment, the upper plate has a plurality of first restraining holes, the lower plate has a plurality of second restraining holes, the partition plate has a plurality of first restraining portions and a plurality of second restraining portions, the first restraining portions are engaged in the first restraining holes, and the second restraining portions are engaged in the second restraining holes.

In an embodiment, the upper plate has a first engaging hole, the lower plate has a second engaging hole, the partition plate has a first engaging portion and a second engaging portion, the first engaging portion is engaged in the first engaging hole, and the second engaging portion is engaged in the second engaging hole.

In an embodiment, the electrical connector cage further comprises a side plate. The side plate has a plurality of third restraining holes and a plurality of fourth restraining holes, the upper plate has a plurality of third restraining portions, the lower plate has a plurality of fourth restraining portions, the third restraining portions are engaged in the third restraining holes, and the fourth restraining portions are engaged in the fourth restraining holes.

According to another embodiment of the invention, an electrical connector comprises a circuit board and an electrical connector cage. The circuit board comprises a plurality of electrical connection sockets. The electrical connector cage is fixed on the circuit board. The electrical connector cage comprises a plurality of slots stacked with each other. The electrical connection sockets are located in the slots. Each of the slots comprises an upper plate, a lower plate and a partition plate. The partition plate connects the upper plate and the lower plate. The lower plate has a plurality of through holes. The partition plate has a plurality of abutting portions. The abutting portions of the partition plate of one of the slots pass through the through holes of the lower plate and abut against the upper plate of another one of the slots, so as to maintain an identical height of a gap between any two adjacent slots.

In an embodiment, each of the abutting portions is formed with a chamfer.

In an embodiment, each of the abutting portions is formed with a rounded corner.

In an embodiment, the upper plate has a plurality of first restraining holes, the lower plate has a plurality of second restraining holes, the partition plate has a plurality of first restraining portions and a plurality of second restraining portions, the first restraining portions are engaged in the first restraining holes, and the second restraining portions are engaged in the second restraining holes.

In an embodiment, the upper plate has a first engaging hole, the lower plate has a second engaging hole, the partition plate has a first engaging portion and a second engaging portion, the first engaging portion is engaged in the first engaging hole, and the second engaging portion is engaged in the second engaging hole.

In an embodiment, the electrical connector cage further comprises a side plate. The side plate has a plurality of third restraining holes and a plurality of fourth restraining holes, the upper plate has a plurality of third restraining portions, the lower plate has a plurality of fourth restraining portions, the third restraining portions are engaged in the third restraining holes, and the fourth restraining portions are engaged in the fourth restraining holes.

As mentioned in the above, the partition plate of the slot of the electrical connector cage has abutting portions. The abutting portions of the slot located above abut against the upper plate of the slot located below. Accordingly, the invention can maintain an identical height of a gap between any two adjacent slots, such that the slots of the electrical connector cage can be accurately positioned with the electrical connection sockets of the circuit board. Thus, when electronic modules are inserted into different slots, they can be reliably connected to the electrical connection sockets, so as to ensure the stability of signal transmission.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
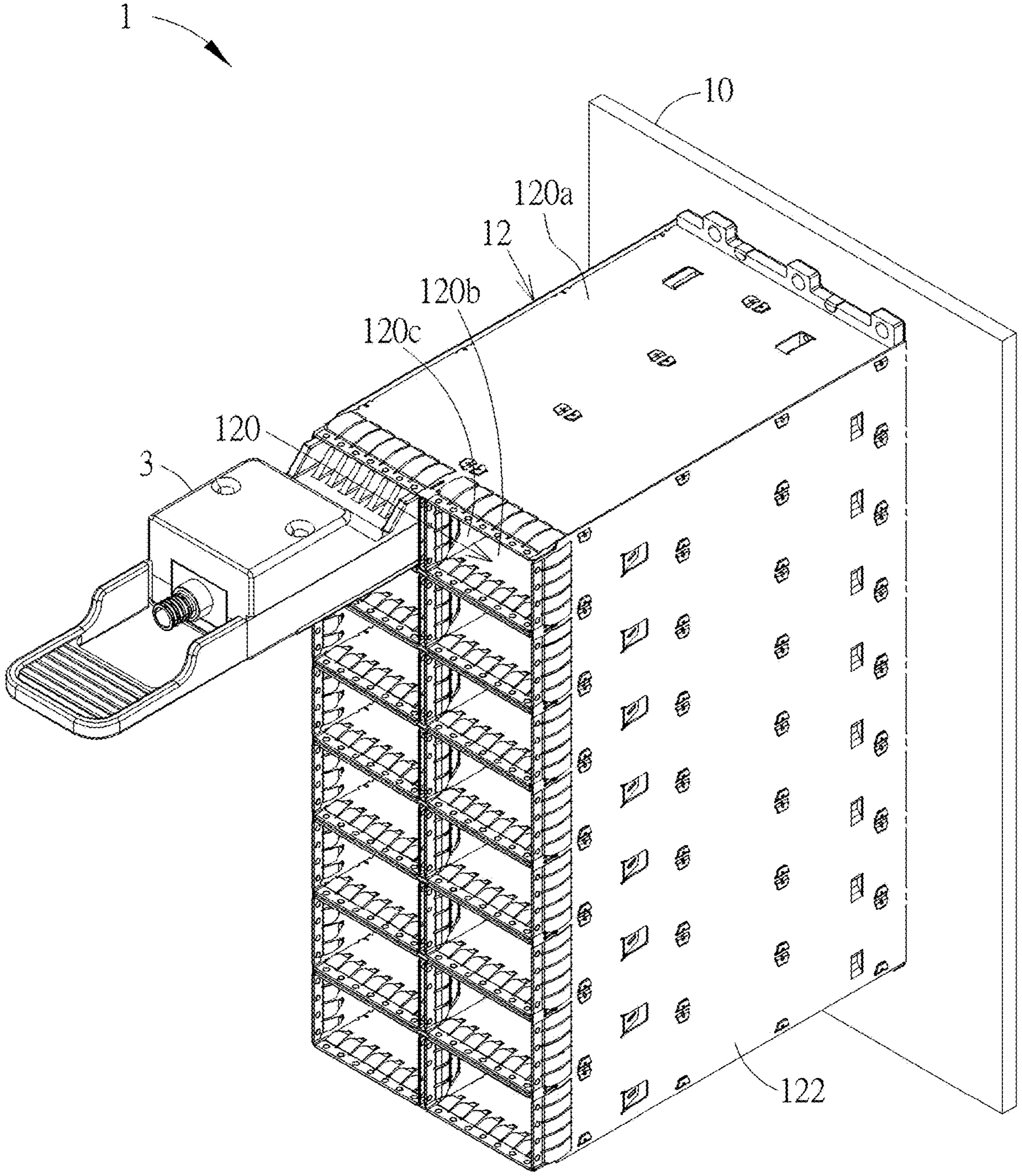
FIG. 1 is an assembly view illustrating an electrical connector and an electronic module according to an embodiment of the invention.
Figure 2:
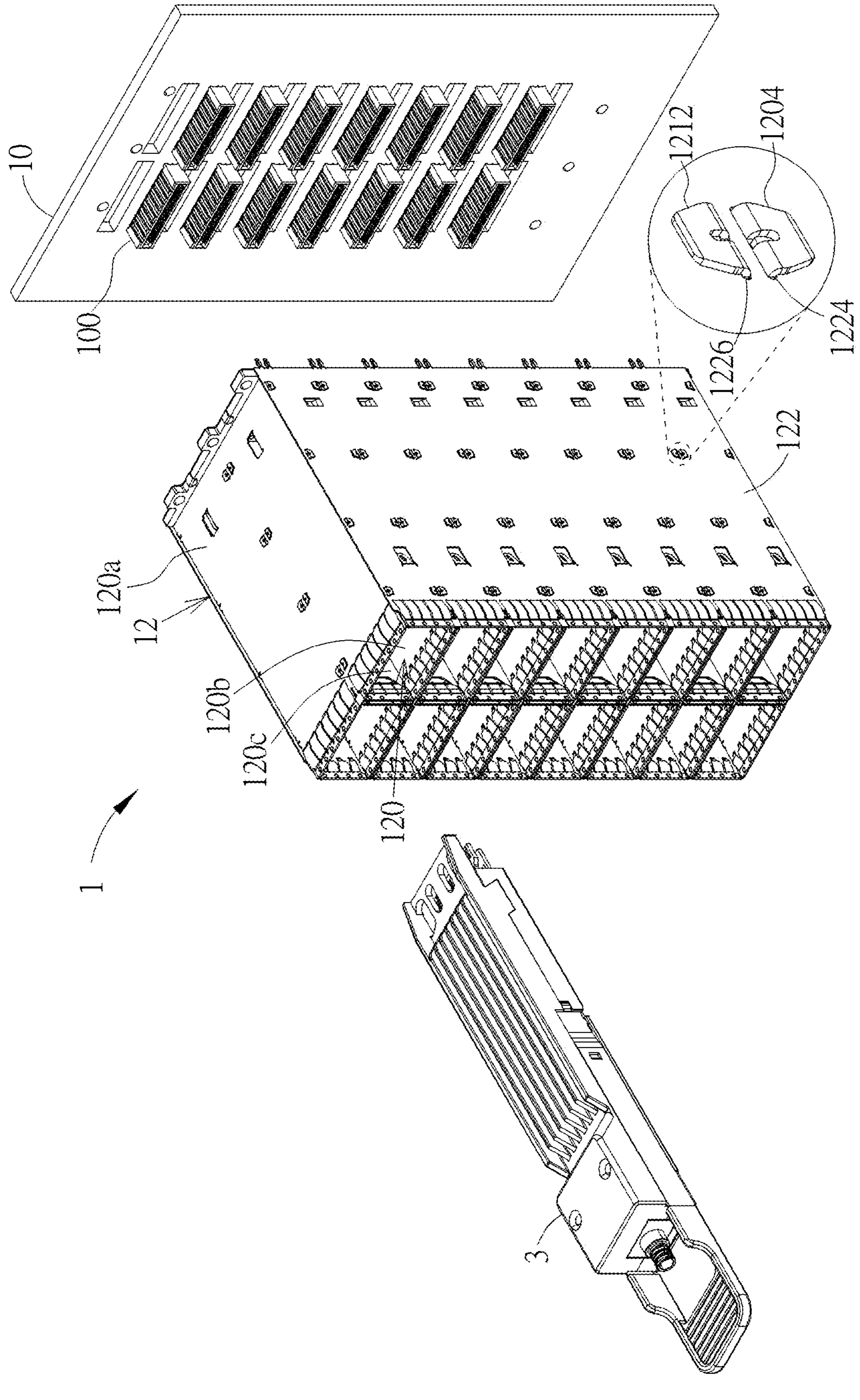
FIG. 2 is an exploded view illustrating the electrical connector and the electronic module shown in FIG. 1.
Figure 3:
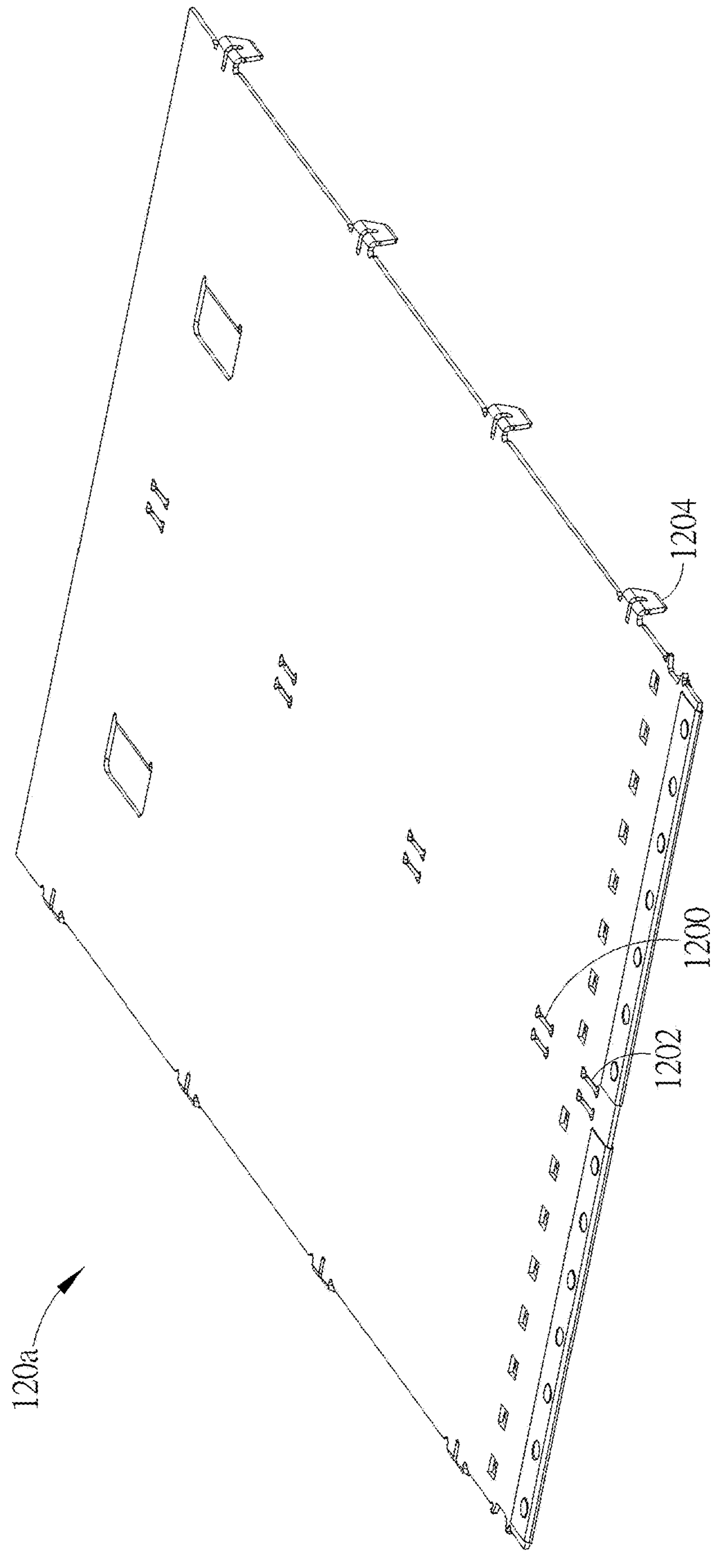
FIG. 3 is a perspective view illustrating an upper plate of an electrical connector cage shown in FIG. 2.
Figure 4:
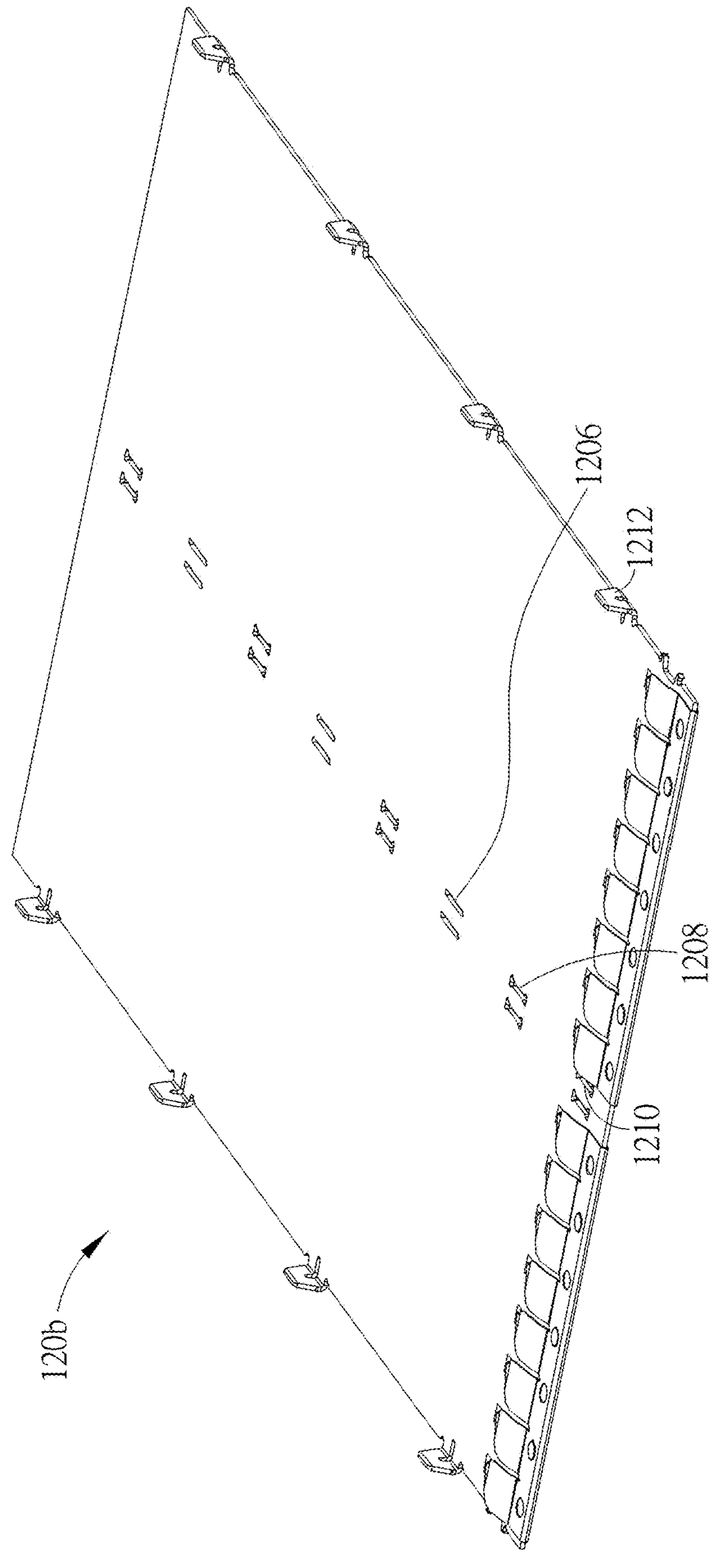
FIG. 4 is a perspective view illustrating a lower plate of the electrical connector cage shown in FIG. 2.
Figure 5:
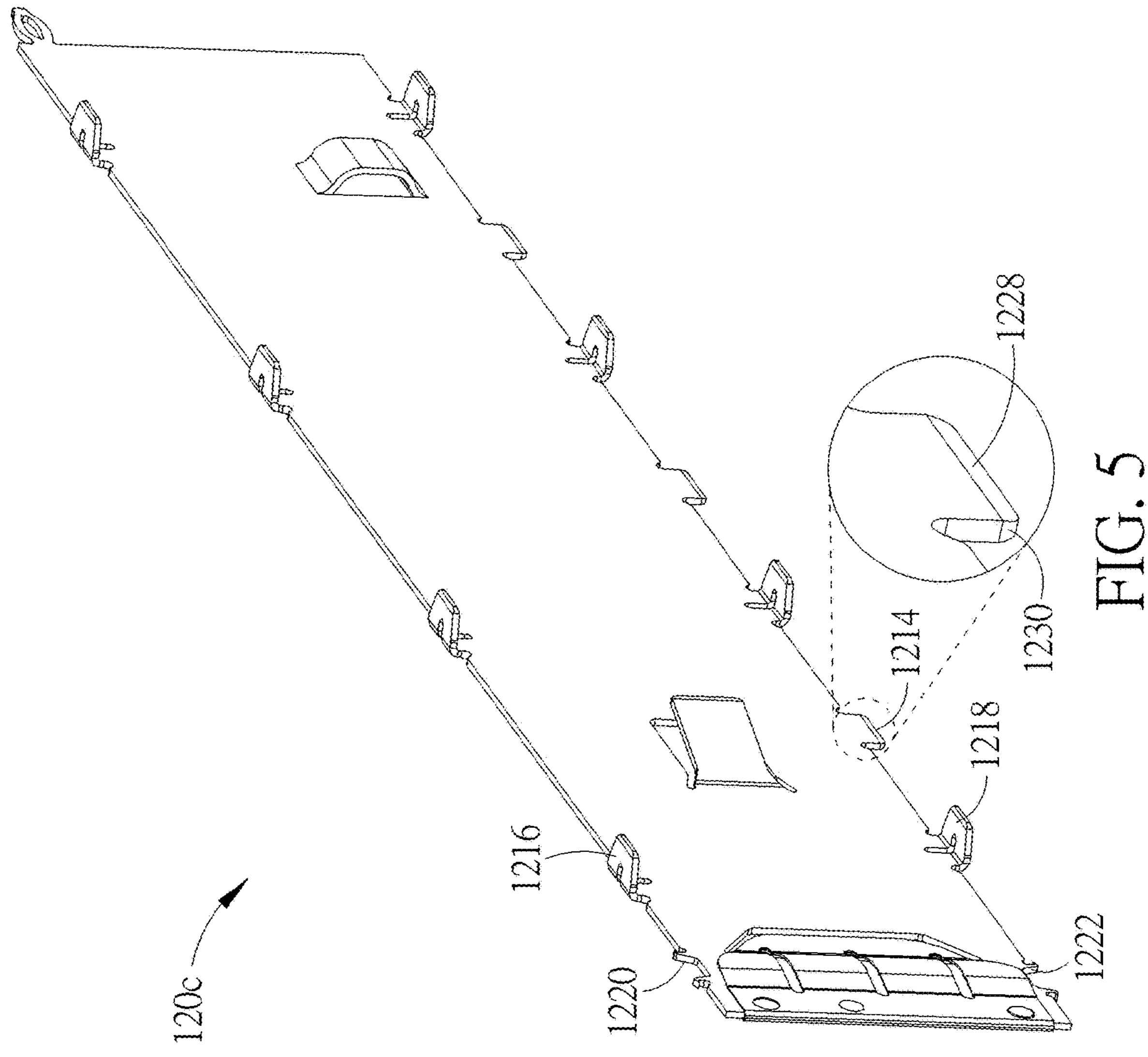
FIG. 5 is a perspective view illustrating a partition plate of the electrical connector cage shown in FIG. 2.
Figure 6:
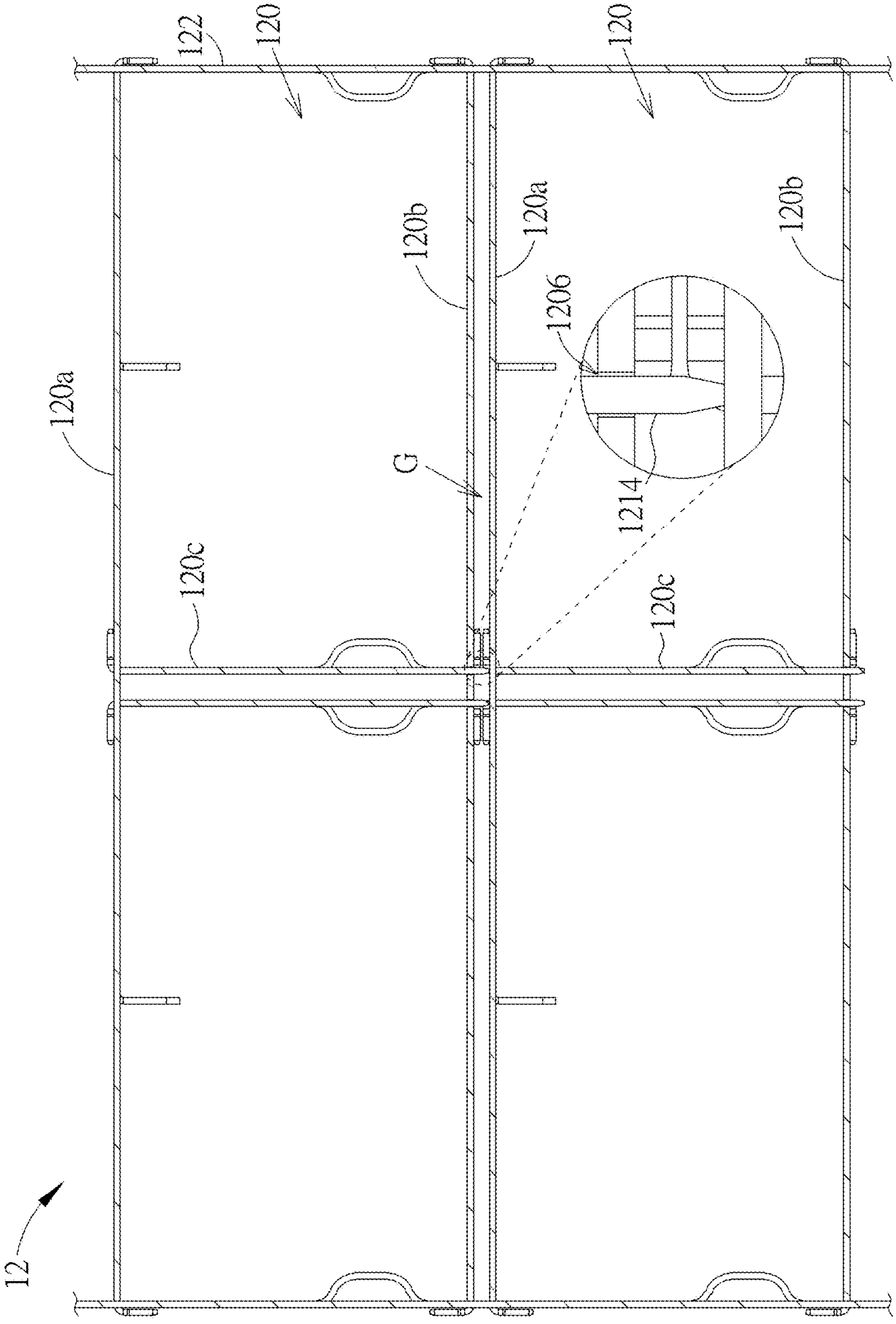
FIG. 6 is a partial sectional view illustrating the electrical connector cage shown in FIG. 2.

Referring to FIGS. 1 to 6, FIG. 1 is an assembly view illustrating an electrical connector 1 and an electronic module 3 according to an embodiment of the invention, FIG. 2 is an exploded view illustrating the electrical connector 1 and the electronic module 3 shown in FIG. 1, FIG. 3 is a perspective view illustrating an upper plate 120*a* of an electrical connector cage 12 shown in FIG. 2, FIG. 4 is a perspective view illustrating a lower plate 120*b* of the electrical connector cage 12 shown in FIG. 2, FIG. 5 is a perspective view illustrating a partition plate 120*c* of the electrical connector cage 12 shown in FIG. 2, and FIG. 6 is a partial sectional view illustrating the electrical connector cage 12 shown in FIG. 2.

As shown in FIGS. 1 and 2, the electrical connector 1 comprises a circuit board 10 and an electrical connector cage 12. The circuit board 10 comprises a plurality of electrical connection sockets 100. The electrical connector cage 12 is fixed on the circuit board 10. The electrical connector cage 12 comprises a plurality of slots 120 stacked with each other, wherein the electrical connection sockets 100 of the circuit board 10 are located in the slots 120 of the electrical connector cage 12. It should be noted that the number of electrical connection sockets 100 and slots 120 may be determined according to practical applications, so the invention is not limited to the embodiment shown in the figure. A user may insert an electronic module 3 into the slot 120 of the electrical connector cage 12 to form an electrical connection with the electrical connection socket 100 on the circuit board 10. The type and function of the electronic module 3 may be determined according to practical applications.

As shown in FIGS. 2 to 6, each of the slots 120 comprises an upper plate 120*a*, a lower plate 120*b* and a partition plate 120*c*, wherein the partition plate 120*c* connects the upper plate 120*a* and the lower plate 120*b*. In this embodiment, two slots 120 on the same layer may share the same upper plate 120*a* and the same lower plate 120*b*, and are separated by two partition plates 120*c*.

As shown in FIG. 3, the upper plate 120*a* has a plurality of first restraining holes 1200, a first engaging hole 1202 and a plurality of third restraining portions 1204. In this embodiment, the third restraining portions 1204 may be bent from a side of the upper plate 120*a*. As shown in FIG. 4, the lower plate 120*b* has a plurality of through holes 1206, a plurality of second restraining holes 1208, a second engaging hole 1210 and a plurality of fourth restraining portions 1212. In this embodiment, the fourth restraining portions 1212 may be bent from a side of the lower plate 120*b*. As shown in FIG. 5, the partition plate 120*c* has a plurality of abutting portions 1214, a plurality of first restraining portions 1216, a plurality of second restraining portions 1218, a first engaging portion 1220 and a second engaging portion 1222. In this embodiment, the first restraining portions 1216 and the second restraining portions 1218 may be bent from opposite sides of the partition plate 120*c*, and the abutting portions 1214 and the second restraining portions 1218 are located at the same side of the partition plate 120*c*. It should be noted that the number of first restraining holes 1200, third restraining portions 1204, through holes 1206, second restraining holes 1208, fourth restraining portions 1212, abutting portions 1214, first restraining portions 1216 and second restraining portions 1218 may be determined according to practical applications, so the invention is not limited to the embodiment shown in the figure.

The first restraining portions 1216 of the partition plate 120*c* are engaged in the first restraining holes 1200 of the upper plate 120*a*, and the first engaging portion 1220 of the partition plate 120*c* is engaged in the first engaging hole 1202 of the upper plate 120*a*, such that the upper plate 120*a* and the partition plate 120*c* are connected with each other. Furthermore, the second restraining portions 1218 of the partition plate 120*c* are engaged in the second restraining holes 1208 of the lower plate 120*b*, and the second engaging portion 1222 of the partition plate 120*c* is engaged in the second engaging hole 1210 of the lower plate 120*b*, such that the lower plate 120*b* and the partition plate 120*c* are connected with each other.

As shown in FIG. 2, each of two opposite sides of the electrical connector cage 12 may comprise a side plate 122, wherein the side plate 122 has a plurality of third restraining holes 1224 and a plurality of fourth restraining holes 1226. The third restraining portions 1204 of the upper plate 120*a* are engaged in the third restraining holes 1224 of the side plate 122, and the fourth restraining portions 1212 of the lower plate 120*b* are engaged in the fourth restraining holes 1226 of the side plate 122, such that the upper plate 120*a* and the lower plate 120*b* are connected with the side plate 122 respectively.

As shown in FIG. 6, the abutting portions 1214 of the partition plate 120*c* of the slot 120 located above may pass through the through holes 1206 of the lower plate 120*b* and abut against the upper plate 120*a* of the slot 120 located below, so as to maintain an identical height of a gap G between any two adjacent slots 120. In other words, the abutting portions 1214 of the partition plate 120*c* of one of the slots 120 may pass through the through holes 1206 of the lower plate 120*b* and abut against the upper plate 120*a* of another one of the slots 120, so as to maintain an identical height of the gap G between any two adjacent slots 120. Accordingly, the slots 120 of the electrical connector cage 12 can be accurately positioned with the electrical connection sockets 100 of the circuit board 10. Thus, when the electronic modules 3 are inserted into different slots 120, they can be reliably connected to the electrical connection sockets 100, so as to ensure the stability of signal transmission. Furthermore, the abutting portions 1214 of the partition plate 120*c* may also effectively improve whole structural strength of the electrical connector cage 12.

As shown in FIG. 5, each of the abutting portions 1214 of the partition plate 120*c* may be formed with a chamfer 1228 and/or a rounded corner 1230. By means of the chamfer 1228 and/or the rounded corner 1230, the abutting portions 1214 of the partition plate 120*c* may pass through the through holes 1206 of the lower plate 120*b* more smoothly, thereby making the assembly more efficient. It should be noted that the abutting portion 1214 may be formed with the chamfer 1228 and the rounded corner 1230 at the same time, or alternatively, formed with one of the chamfer 1228 and the rounded corner 1230, and it depends on practical applications. In another embodiment, the abutting portion 1214 may not have the chamfer 1228 and the rounded corner 1230.

As mentioned in the above, the partition plate of the slot of the electrical connector cage has abutting portions. The abutting portions of the slot located above abut against the upper plate of the slot located below. Accordingly, the invention can maintain an identical height of a gap between any two adjacent slots, such that the slots of the electrical connector cage can be accurately positioned with the electrical connection sockets of the circuit board. Thus, when electronic modules are inserted into different slots, they can be reliably connected to the electrical connection sockets, so as to ensure the stability of signal transmission.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical connector cage comprising:

a plurality of slots stacked with each other, each of the slots comprising an upper plate, a lower plate and a partition plate, the partition plate connecting the upper plate and the lower plate, the lower plate having a plurality of through holes, the partition plate having a plurality of abutting portions, the abutting portions of the partition plate of one of the slots passing through the through holes of the lower plate and abutting against the upper plate of another one of the slots, so as to maintain an identical height of a gap between any two adjacent slots.

2. The electrical connector cage of claim 1, wherein each of the abutting portions is formed with a chamfer.

3. The electrical connector cage of claim 1, wherein each of the abutting portions is formed with a rounded corner.

4. The electrical connector cage of claim 1, wherein the upper plate has a plurality of first restraining holes, the lower plate has a plurality of second restraining holes, the partition plate has a plurality of first restraining portions and a plurality of second restraining portions, the first restraining portions are engaged in the first restraining holes, and the second restraining portions are engaged in the second restraining holes.

5. The electrical connector cage of claim 1, wherein the upper plate has a first engaging hole, the lower plate has a second engaging hole, the partition plate has a first engaging portion and a second engaging portion, the first engaging portion is engaged in the first engaging hole, and the second engaging portion is engaged in the second engaging hole.

6. The electrical connector cage of claim 1, further comprising a side plate, wherein the side plate has a plurality of third restraining holes and a plurality of fourth restraining holes, the upper plate has a plurality of third restraining portions, the lower plate has a plurality of fourth restraining portions, the third restraining portions are engaged in the third restraining holes, and the fourth restraining portions are engaged in the fourth restraining holes.

7. An electrical connector comprising:

a circuit board comprising a plurality of electrical connection sockets;

an electrical connector cage fixed on the circuit board, the electrical connector cage comprising a plurality of slots stacked with each other, the electrical connection sockets being located in the slots, each of the slots comprising an upper plate, a lower plate and a partition plate, the partition plate connecting the upper plate and the lower plate, the lower plate having a plurality of through holes, the partition plate having a plurality of abutting portions, the abutting portions of the partition plate of one of the slots passing through the through holes of the lower plate and abutting against the upper plate of another one of the slots, so as to maintain an identical height of a gap between any two adjacent slots.

8. The electrical connector of claim 7, wherein each of the abutting portions is formed with a chamfer.

9. The electrical connector of claim 7, wherein each of the abutting portions is formed with a rounded corner.

10. The electrical connector of claim 7, wherein the upper plate has a plurality of first restraining holes, the lower plate has a plurality of second restraining holes, the partition plate has a plurality of first restraining portions and a plurality of second restraining portions, the first restraining portions are engaged in the first restraining holes, and the second restraining portions are engaged in the second restraining holes.

11. The electrical connector of claim 7, wherein the upper plate has a first engaging hole, the lower plate has a second engaging hole, the partition plate has a first engaging portion and a second engaging portion, the first engaging portion is engaged in the first engaging hole, and the second engaging portion is engaged in the second engaging hole.

12. The electrical connector of claim 7, wherein the electrical connector cage further comprises a side plate, the side plate has a plurality of third restraining holes and a plurality of fourth restraining holes, the upper plate has a plurality of third restraining portions, the lower plate has a plurality of fourth restraining portions, the third restraining portions are engaged in the third restraining holes, and the fourth restraining portions are engaged in the fourth restraining holes.

* * * * *